(12) United States Patent
Pettissalo

(10) Patent No.: US 11,428,726 B2
(45) Date of Patent: Aug. 30, 2022

(54) METHOD AND APPARATUS FOR DETECTING FAULTS IN A THREE-PHASE ELECTRICAL DISTRIBUTION NETWORK

(71) Applicant: EMTELE OY, Tampere (FI)

(72) Inventor: Seppo Pettissalo, Tampere (FI)

(73) Assignee: EMTELE OY, Tampere (FI)

( * ) Notice: Subject to any disclaimer, the term of this patent is extended or adjusted under 35 U.S.C. 154(b) by 937 days.

(21) Appl. No.: 16/303,732

(22) PCT Filed: May 23, 2017

(86) PCT No.: PCT/FI2017/050382
§ 371 (c)(1),
(2) Date: Nov. 21, 2018

(87) PCT Pub. No.: WO2017/203099
PCT Pub. Date: Nov. 30, 2017

(65) Prior Publication Data
US 2020/0341046 A1 Oct. 29, 2020

(30) Foreign Application Priority Data
May 23, 2016 (FI) ..................................... 20160137

(51) Int. Cl.
*G01R 31/08* (2020.01)
*H02H 1/00* (2006.01)
*H02H 7/26* (2006.01)

(52) U.S. Cl.
CPC ......... *G01R 31/085* (2013.01); *H02H 1/0007* (2013.01); *H02H 7/26* (2013.01)

(58) Field of Classification Search
CPC ...... G01R 31/085; H02H 1/0007; H02H 7/26; H02H 7/28; H02H 3/165; H02H 3/343; H02H 7/267
See application file for complete search history.

(56) References Cited

U.S. PATENT DOCUMENTS

| | | | | |
|---|---|---|---|---|
| 2013/0221976 A1* | 8/2013 | Blumschein | ......... | G01R 31/088 324/509 |
| 2016/0187406 A1* | 6/2016 | Liu | ........................ | G01R 31/58 702/58 |

FOREIGN PATENT DOCUMENTS

| | | |
|---|---|---|
| CN | 102590646 A | 7/2012 |
| CN | 104569729 A | 4/2015 |

(Continued)

OTHER PUBLICATIONS

Finnish Patent and Registration Office, Search report of Finnish application No. 20160137, dated Jan. 4, 2017, 2 pages.

*Primary Examiner* — Alexander Satanovsky
*Assistant Examiner* — Asm Fakhruddin
(74) *Attorney, Agent, or Firm* — Thomas | Horstemeyer, LLP

(57) ABSTRACT

A method for detecting faults (4) in a three-phase electrical distribution network comprising determining a zero sequence current (21 C), a first phase current (21A) and a second phase current (21 B) at a location of the three-phase electrical distribution network, determining first filtered currents (22) by removing a frequency component from the determined currents corresponding to a fundamental frequency of the electrical distribution network through filtering out said frequency component, determining directions of the first filtered currents during a first time period (23), and comparing said directions (24) relatively to each other, and, if at least one of the determined directions is opposite with respect to at least one of the other two determined directions, signaling a detection of a fault (25).

13 Claims, 10 Drawing Sheets

(56) References Cited

FOREIGN PATENT DOCUMENTS

| | | | |
|---|---|---|---|
| EP | 2383856 A1 * | 11/2011 | ........... G01R 31/085 |
| EP | 2544014 A1 | 1/2013 | |
| EP | 2544322 A1 | 1/2013 | |
| EP | 2752674 A1 | 7/2014 | |
| FR | 2687860 B1 * | 3/2016 | ............. G01R 31/08 |
| GB | 2012505 A | 7/1979 | |
| JP | H0833318 A | 2/1996 | |
| JP | 2633637 B2 * | 7/1997 | ............... H02H 3/34 |
| JP | H11355955 A | 12/1999 | |
| JP | 3218163 B2 | 10/2001 | |
| WO | 2005038474 A1 | 4/2005 | |
| WO | WO 2005/038474 A1 * | 4/2005 | ............. G01R 31/08 |

\* cited by examiner

METHOD AND APPARATUS FOR DETECTING FAULTS IN A THREE-PHASE ELECTRICAL DISTRIBUTION NETWORK

This application is a U.S national application of the international application number PCT/FI2017/050382 filed on 23 May 2017, which claims priority of Finnish patent application FI20160137 filed on May 23, 2016, the contents of all of which are incorporated herein by reference.

TECHNICAL FIELD

The invention concerns in general the technical field of detecting faults in electrical distribution networks. Especially the invention concerns detecting ground faults in radially operated medium voltage electrical distribution networks, such as in compensated, centrally, in distributed or in hybrid manner, or in networks with isolated neutral, comprising of underground and/or overhead cables and/or overhead lines.

BACKGROUND

During a line-to-ground fault, one phase of an electrical distribution network is in contact with the ground potential. This causes current to flow out of the network from the fault location and back into the network via line-to-ground capacitances and/or via grounding arrangements. This causes potentially dangerous contact voltages and it is, therefore, important to recognize these fault conditions and disconnect the faulty part of the distribution network.

The faults may be permanent-type ground faults in which case once the fault occurs, the fault condition typically remains permanently in the network until the fault is being removed. The fault current during a permanent-type fault is characterized as mainly having the fundamental frequency of the electrical network, such as 50 or 60 Hz.

There may also be faults which are of the arcing-type or intermittent ground faults in which case the fault occurs for short periods of time (i.e. one fault event) but, typically, repeatedly for a number of times in a row. The fault may occur, e.g., due to a faulty insulation. When an arcing-type or intermittent fault occurs, it comprises a rapid discharging part during which the phase-to-ground capacitance(s) of the faulty phase discharge(s) and a slower charging part during which the capacitances of the healthy phases charges as their voltages rise to main voltages with respect to ground. The rapid discharging part and the slower charging part of the currents sums up to form the overall ground fault current. The rapid discharging part causes short peak visible in the zero sequence current and the current of the faulty phase. The peak then distinguishes and the transient current comprises mainly of the slower charging current part. Typical duration of the rapid discharging current part may be some hundreds of microseconds, for example, from 100 to 200 microseconds. The duration of one arcing-type or intermittent fault event may typically be around 1 to 3 milliseconds.

The fault current during a ground fault can be made smaller by using a compensation reactor, e.g. Petersen coil, connected to the neutral of the transformer. These systems are called resonant grounding systems. By choosing the inductance of the reactor to match the capacitances of the distribution network, the capacitive fault current can be compensated by an inductive current of equal magnitude.

Some prior art describes methods for locating faults in the electrical distribution networks. It is typical that the locating of the fault is done by performing test measurements which require a lot of effort and manpower and are time-consuming. These measurements can also damage the electrical distribution system due to the operation of circuit breakers which have to be closed despite of the fault in the distribution network.

There are also methods developed which are based on measurements and fault locating algorithms. These methods are typically based on either centralized measurements in a substation or, alternatively, on distributed measurements in multiple locations of the distribution network and along the lines.

Several methods based on centralized measurements have been developed. These methods are based on algorithms estimating the distance of the fault from the substation. All of these methods have limitations such as localizing the fault to the right branch of the network and none of these methods have really been utilized in large-scale. Especially there are difficulties in locating faults in compensated electrical distribution networks.

As mentioned, there are also methods utilizing distributed measurements. These methods are typically based on measurement of zero-sequence current and voltage and observing the change in these parameters. These methods can be utilized to recognize the faulty branch of a feeder if the disconnector station is equipped with appropriate measurements and a remote control capability. Another known method for recognizing faulty branch is based on comparing the zero-sequence current of different branches during the fault.

SUMMARY

An objective of the invention is to present methods, fault detector control units, fault detectors and arrangements for implementing the methods to alleviate one or more of the above disadvantages related to detecting faults in an electrical distribution network. The objectives of the invention are reached by the method, the fault detector control unit, the fault detector and the arrangement as defined by the respective independent claims. The preferred embodiments of the invention are disclosed in the dependent claims.

The invention according to a first aspect is a method for detecting faults in a three-phase electrical distribution network. The method comprises
 determining a zero sequence current, a first phase current and a second phase current at a location of the three-phase electrical distribution network,
 determining a first filtered zero sequence current, a first filtered first phase current and a first filtered second phase current by removing a frequency component from the zero sequence, the first phase and the second phase currents corresponding to a fundamental frequency of the electrical distribution network through filtering out said frequency component, said first filtered currents thereby including frequency components other than said removed frequency component,
 determining a direction of the first filtered zero sequence current, a direction of the first filtered first phase current and a direction of the first filtered second phase current during a first time period,
 comparing said directions relatively to each other, and, if at least one of the determined directions is opposite with respect to at least one of the other two determined directions,
 signaling a detection of a fault.

Furthermore, the method may comprise determining a second filtered zero sequence current, a second filtered first phase current and a second filtered second phase current by filtering the zero sequence current, the first phase current and the second phase current with respect to the fundamental frequency of the electrical distribution network, said second filtered currents thereby comprising only said fundamental frequency component.

The method may also, prior to the determination of said first filtered currents, comprise determining a negative sequence current based on the zero sequence, the first phase and the second phase currents or based on said second filtered currents during a second time period, determining a magnitude of a change during the second time period in the negative sequence current based on values of the negative sequence current temporally before and after a fault, comparing said change to a value of zero sequence current temporally after said fault, and, if the magnitude of said change with respect to the zero sequence current after said fault exceeds a second threshold, signaling a detection of said fault.

The method may also comprise, prior to the determination of the zero sequence current, the first phase current and the second phase current at the location of the three-phase electrical distribution network, comparing a value of zero sequence current to a first threshold, and performing the method according to an embodiment of the present invention if the value of zero sequence current exceeds the first threshold.

The method may comprise, prior to the determination of said first filtered currents, determining a positive sequence current during a third time period based on the frequency component of the zero sequence, the first phase and the second phase currents corresponding to the fundamental frequency of the electrical distribution network or based on said second filtered currents, comparing the positive sequence current to a third threshold and, if the positive sequence current exceeds the third threshold, signaling a detection of a fault.

The method may also comprise determining zero sequence current directly by a measurement of a sum of phase currents.

The determination of the zero sequence current, the first phase current and the second phase current at the location of the three-phase electrical distribution network may comprise determining the zero sequence current, the first phase current and the second phase current with a first sampling frequency.

At least one of negative sequence current and the positive sequence current may be determined based on a determination of the zero sequence current, the first phase current and the second phase current with a second sampling frequency.

At least one of negative sequence current and the positive sequence current may be determined based on a determination of the zero sequence, the first phase and the second phase current by down-sampling the determined the first phase, the second phase and zero sequence currents.

The invention is according to a second aspect is a fault detector control unit for detecting faults in a three-phase electrical distribution network. The fault detector control unit comprises at least one processor and at least one memory storing at least one portion of computer program code, wherein the at least one processor being configured to cause the fault detector control unit at least to perform:

determine a zero sequence current, a first phase current and a second phase current at a location of the three-phase electrical distribution network, determine a first filtered zero sequence current, a first filtered first phase current and a first filtered second phase current by removing a frequency component from the zero sequence, the first phase and the second phase currents corresponding to a fundamental frequency of the electrical distribution network through filtering out said frequency component, said first filtered currents thereby including frequency components other than said removed frequency component, determine a direction of the first filtered zero sequence current, a direction of the first filtered first phase current and a direction of the first filtered second phase current during a first time period, compare said directions relatively to each other, and, if at least one of the determined directions is opposite with respect to at least one of the other two determined directions, signal a detection of a fault.

The invention is according to a third aspect a fault detector comprising a fault detector control unit according to the second aspect for detecting faults in a three-phase electrical distribution network. The fault detector further comprises means for determining a zero sequence current, a first phase current and a second phase current, means for inputting the determined zero sequence current, the first phase current and the second phase current to the fault detector control unit, and means for external communication.

The invention is according to a fourth aspect an arrangement comprising a number of fault detectors according to the third aspect for detecting faults in a three-phase electrical distribution network. The arrangement comprises the number of fault detectors arranged along a three-phase electrical distribution network for detecting faults based on signaling a detection of a fault by at least one of the number of fault detectors via a communication network to a network management system.

The invention is according to a fifth aspect a computer program product which comprises program instructions which when executed by a fault detector control unit according to the second aspect cause the fault detector control unit to perform the method according to the first aspect.

An advantage of the methods, devices and arrangements according to the present invention is that detection of faults can be reliably determined based on the measurements and location of the fault detectors and the fault detection and/or non-detection signals from the fault detectors. Another advantage is that the fault detectors according to the present invention can be made relatively simply and affordably and, therefore, it is also economically feasible to arrange fault detectors in multiple locations in an electrical distribution network to achieve sufficient accuracy for detecting and assisting in locating of faults.

The expression "a number of" refers herein to any positive integer starting from one, e.g. to one, two, or three.

The expression "a plurality of" refers herein to any positive integer starting from two, e.g. to two, three, or four.

The terms "first", "second", "third" do not denote any order, quantity, or importance, but rather are used to distinguish one element from another.

The exemplary embodiments of the invention presented in this patent application are not to be interpreted to pose limitations to the applicability of the appended claims. The verb "to comprise" is used in this patent application as an open limitation that does not exclude the existence of also un-recited features. The features recited in depending claims are mutually freely combinable unless otherwise explicitly stated.

BRIEF DESCRIPTION OF FIGURES

The embodiments of the invention are illustrated by way of example, and not by way of limitation, in the figures of the accompanying drawings.

DESCRIPTION OF SOME EMBODIMENTS

Figure 1A:
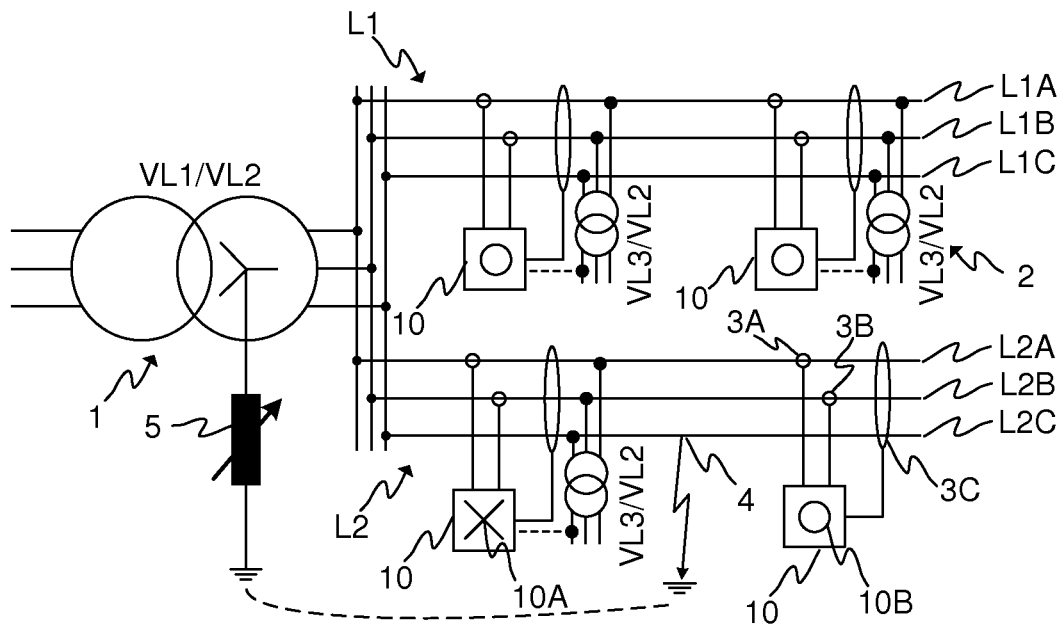
FIGS. 1A and 1B illustrate schematically examples of an electrical distribution network, compensated or with an isolated neutral, respectively, comprising of underground and/or overhead cables and/or overhead lines, along which the fault detectors according to the present invention may be arranged and utilized to detect faults.

FIG. 1A illustrates schematically an example of a compensated electrical distribution network comprising of underground and/or overhead cables and/or overhead lines, along which the fault detectors 10 according to the present invention may be arranged and utilized to detect the passing of fault currents.

The fault detectors 10 may be arranged in connection with means for current determination of medium voltage electrical distribution network. The means for current determination may comprise current transformers, current sensors 3A-3C, Rogowski coils 3C, Hall sensors, etc. There may also be means for determination of voltage of medium voltage electrical distribution networks comprising, for example, measurement transformers, capacitive voltage dividers, resistive voltage dividers, etc.

Figure 1B:
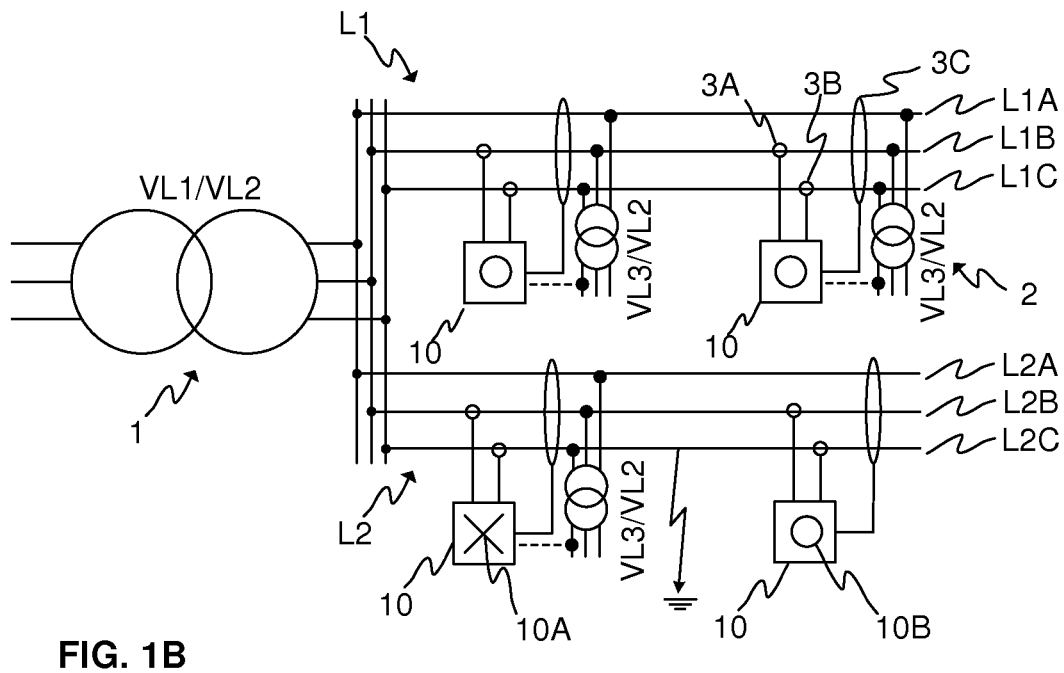

The electrical distribution networks in FIGS. 1A and 1B may have a radial structure, or a radially operated meshed structure. The compensation may be implemented by in central, distributed or hybrid manner. The electrical distribution network may comprise a number of transformers 1, 2 which transforms electrical quantities, such as voltages and currents, to various levels, such as voltage levels 1-3, VL1, VL2, VL3, respectively.

The transformers 1, 2 may have one or several primary side circuits and/or one or several secondary side circuits and/or tertiary circuits, etc. There may be typical switchgear arranged in connection with the main transformer 1 comprising measurement devices, relays, switches, etc.

In FIG. 1A, the compensation is implemented in central manner utilizing an adjustable Petersen coil 5. There are two lines, the first line L1 and the second line L2, shown FIGS. 1A and 1B, both having three phases, L1A, L1B, L1C and L2A, L2B, L2C, respectively.

FIGS. 1A and 1B illustrate example scenarios in which there is a single-phase-to-ground fault on the third phase L2C of the second line L2. The fault detector 10 on the second line L2 to the left of the fault location 4 detects the passing fault current and is marked with an "X" inside the box representing the fault detector 10, while the rest of the fault detectors 10 arranged along the network do not detect the fault current, i.e., they are marked with an "O" inside the box representing the fault detector 10 in FIGS. 1A and 1B.

There may be, as shown in FIG. 1A, at least one main transformer 1 which have at one side a first voltage level VL1 and on the other side a second voltage level VL2. According to the example of the electrical distribution network shown in FIG. 1A, the first voltage level VL1 of the main transformer 1 represents high voltage level of the transmission network. According to the example of the electrical distribution network shown in FIG. 1A, the second voltage level VL2 represents medium voltage level of the electrical distribution network.

There may also be at least one distribution transformer 2 which have at one side the second voltage level VL2 and on the other side a third voltage level VL3. According to the example of the electrical distribution network shown in FIG. 1A, the third voltage level VL3 represents low voltage level of the electrical distribution network. There may be switches, devices with remote control capability and sensors arranged in connection with the at least one distribution transformer 2.

According to some embodiments, voltage levels VL1 and VL2 may be, for example, from 70 kV to 1000 kV and 1.5 kV up to 70 kV, respectively. Voltage level VL3 may be, for example, from 0 kV up to 1.5 kV.

FIG. 1B illustrates schematically an example of an electrical distribution network having an isolated neutral comprising of underground and/or overhead cables and/or overhead lines, along which the fault detectors 10 according to the present invention may be arranged. The electrical distribution network according to FIG. 1B may also comprise transformers 1, 2 similarly to the example shown in FIG. 1A and as explained herein related to FIG. 1A.

Figure 2:
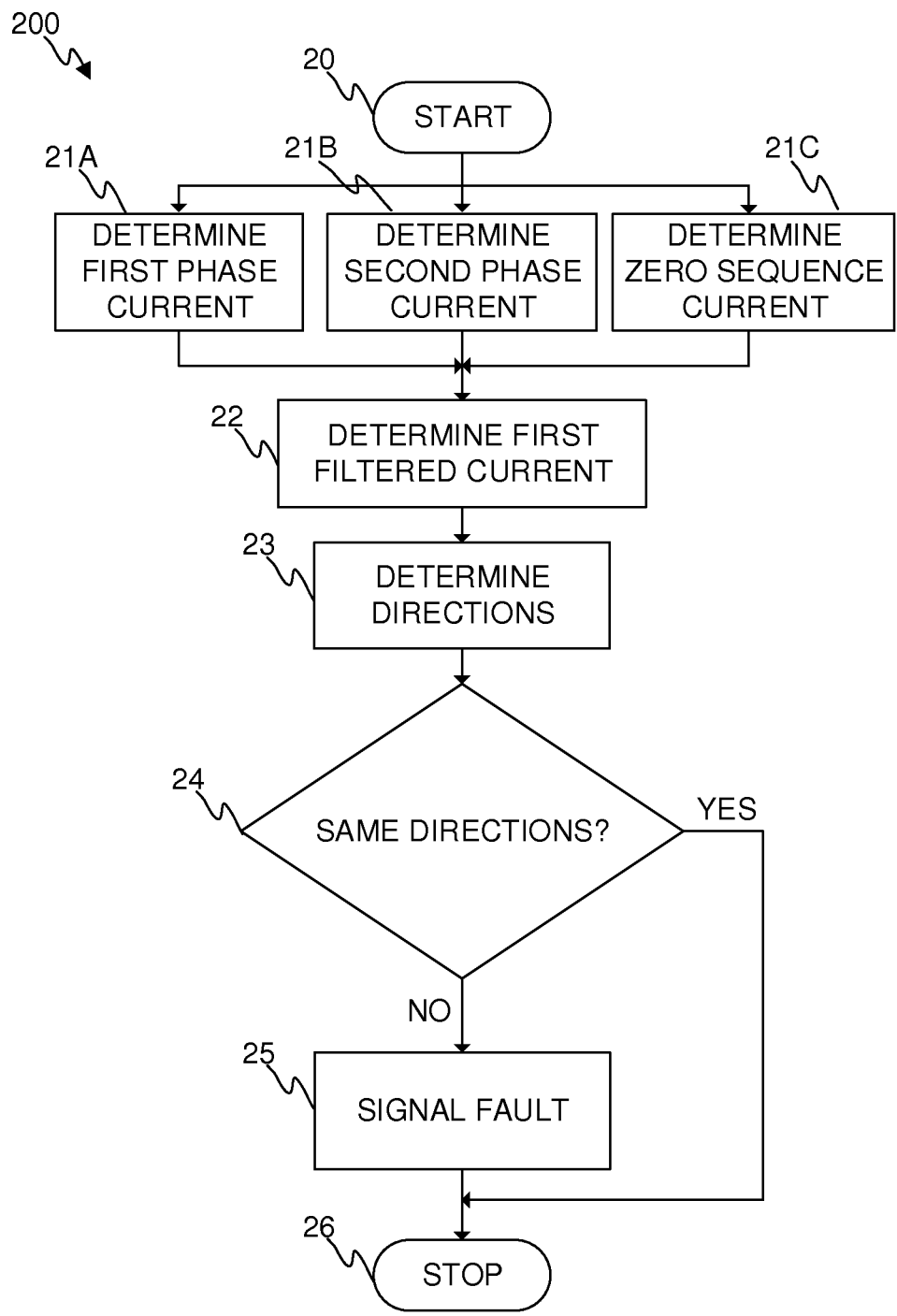
FIG. 2 illustrates a flow diagram of an embodiment of the method according to the present invention.

FIG. 2 shows a flow diagram of a method 200 according an embodiment of the present invention for detecting passing of fault currents, especially of arcing-type ground faults.

Step 20 refers to a start-up phase of the method. A need for detection of faults is being established and appropriate devices are obtained and arranged in connection with the electrical distribution network. Devices may be configured and communication between different elements in the electrical distribution network may be established. The start-up phase 20 may include criteria for initialization of the method such as, for example, the value of zero sequence current, or the sum of the phase currents, exceeding a first threshold. There may also be other sources utilized to detect and indicate the existence of a fault in the network such as by a relay at the substation or information from a network management system or based on the level of determined zero sequence voltage.

The zero sequence current or the sum of phase currents as defined herein are to be understood as being substantially the same values with the obvious difference of a multiplier ⅓, which may be taken appropriately into account when implementing an embodiment of the present invention, i.e. the zero sequence current is ⅓ times the sum of the phase currents.

Steps 21A, 21B, 21C may, preferably, be performed substantially simultaneously. In step 21A, a first phase current is being determined. In step 21B a second phase current is being determined. In step 21C, a zero sequence current, or a sum of the phase currents, is being determined.

According to an embodiment, the zero sequence current may also be determined by determining each of the phase currents separately by using the amount of current measurement instruments equal to the number of phases in the electrical distribution network.

The zero sequence current or the sum of phase currents may, preferably, be determined instantaneously. Additionally, according to an embodiment, the zero sequence current may also be determined based on samples representing one fundamental cycle of the electrical distribution network, such as consecutive samples during 20 or about 16.7 milliseconds depending on the fundamental frequency of the electrical distribution grid, i.e. 50 or 60 Hz, respectively.

Currents determined in steps 21A, 21B, 21C may be determined by, for example, measurements using current sensors or Rogowski coil sensors 3C. In step 21C, the zero sequence current may, preferably, be determined by a direct measurement utilizing a Rogowski coil sensor 3C which increases sensitivity of the measurement. The Rogowski coil sensor 3C measuring the zero sequence current may also be used to detect a fault condition in the electrical distribution network at start-up phase 20 of the method.

Steps 21A-21C may include determining each one of the first phase current, the second phase current and the zero sequence current with a first sampling frequency. The first sampling frequency may, preferably, be 12.8 kHz, which yields 32 samples for each current during a 2.5-millisecond time period, which is of the order typical for an arcing-type ground fault event. The first sampling frequency may also be 9.6 kHz or 19.2 kHz.

Step 22 comprises determining a first filtered zero sequence current, a first filtered first phase current, and a first filtered second phase current. The determined currents in steps 21A, 21B and 21C may comprise low frequency components such as a fundamental frequency component of the electrical distribution network which may be, for example, 50 or 60 Hz. There may also be harmonic and/or sub-harmonic frequency components present in the determined currents, or other various frequency components. In step 22, the determined currents, i.e. the zero sequence current, the first phase current, and the second phase current, may be filtered, for example, by a low-pass filter having cut-off frequency of the order of 75, 100 or 125 Hz in order to determine the first filtered zero sequence current, the first filtered first phase current, and the first filtered second phase current. Both analog and digital filtering may be utilized. The determination may comprise using analog filters or, preferably, by means of digital filtering. Different frequency components may be determined by using numerical methods such as utilizing Fast Fourier Transform (FFT) implemented on at least one processor.

Step 23 comprises determining a direction or a polarity of the first filtered currents. Once the fundamental frequency component has been filtered out from the determined currents in step 22, there are only other than the fundamental frequencies present in the first filtered currents. By filtering out the fundamental frequency component from the determined currents in steps 21A-21C, the direction or polarity of the first filtered currents may be determined.

Figure 12A:
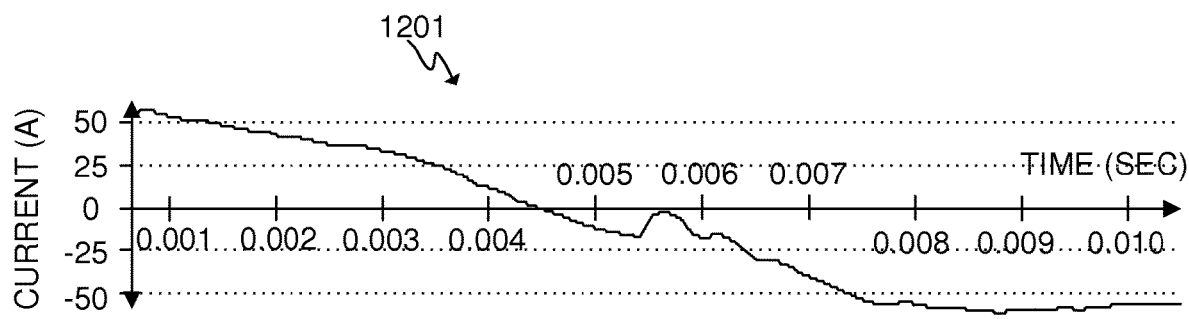
FIGS. 12A-12C illustrate measured phase currents of an electrical distribution network and the effect of an arcing-type ground fault on the measured currents.
Figure 12B:
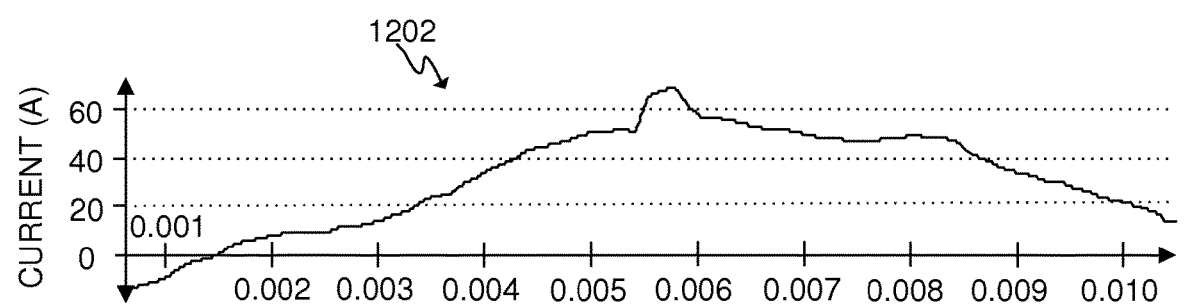
Figure 12C:
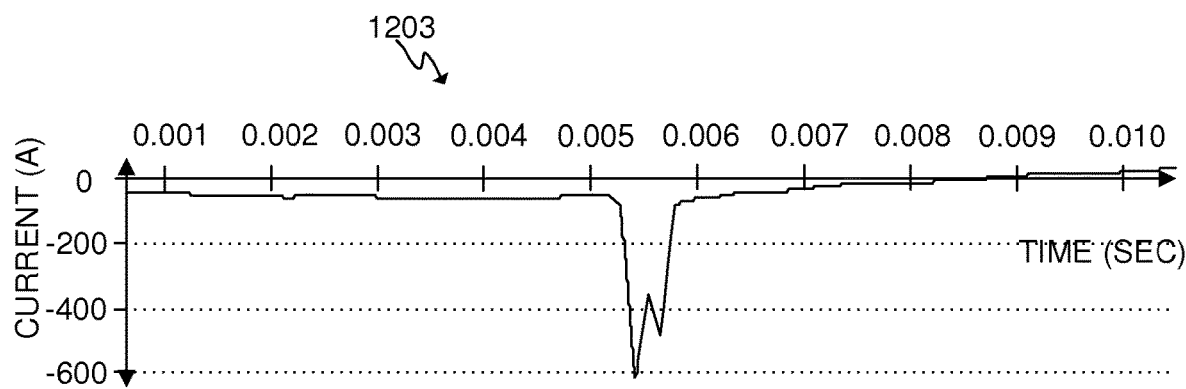

The need and advantage of filtering out the fundamental frequency is further illustrated in FIGS. 12A-12C in which measured phase currents 1201-1203 are shown. As can be seen in FIG. 12A, the change in the phase current due to an arcing-type ground fault may be so small that although the direction or the polarity of the change is positive, the polarity of the total current including the effect of the fundamental frequency component of the phase current is still negative.

Figure 3:
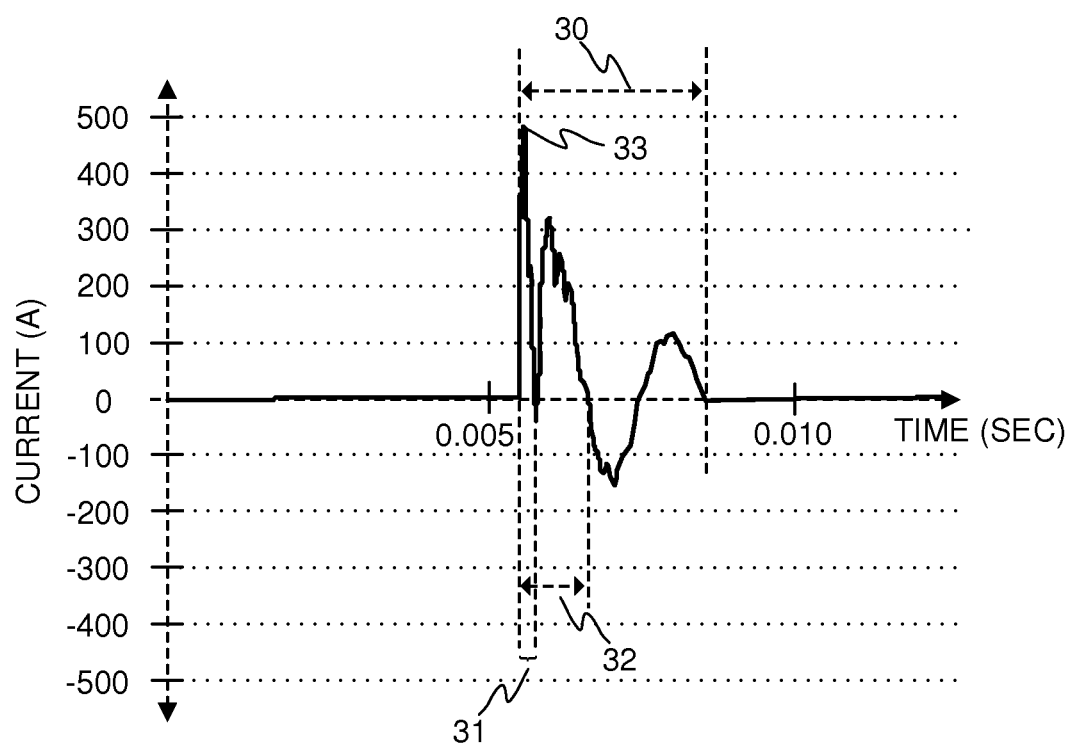
FIG. 3 illustrates fault current during one arcing-type or intermittent ground fault event.
Figure 4A:
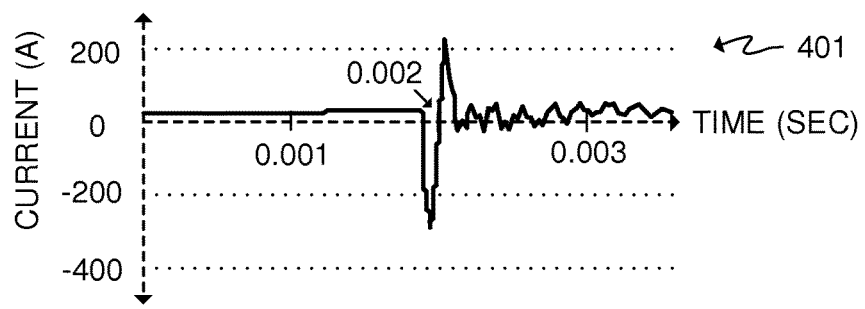
FIGS. 4A-4D illustrate currents of three phases and zero sequence current, respectively, of an healthy line during one arcing-type or intermittent ground fault event.
Figure 4B:
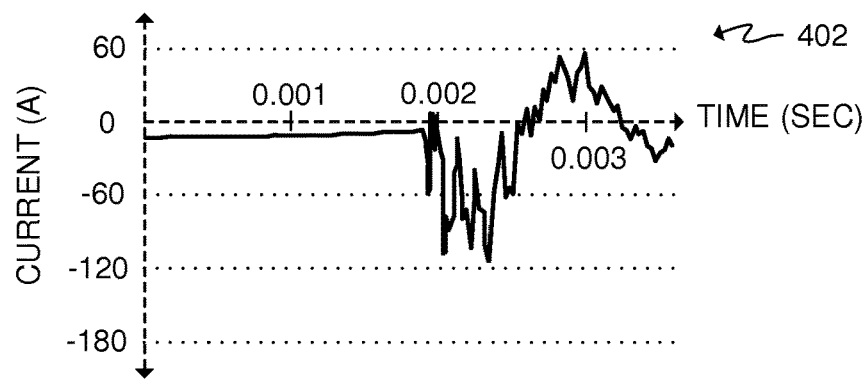
Figure 4C:
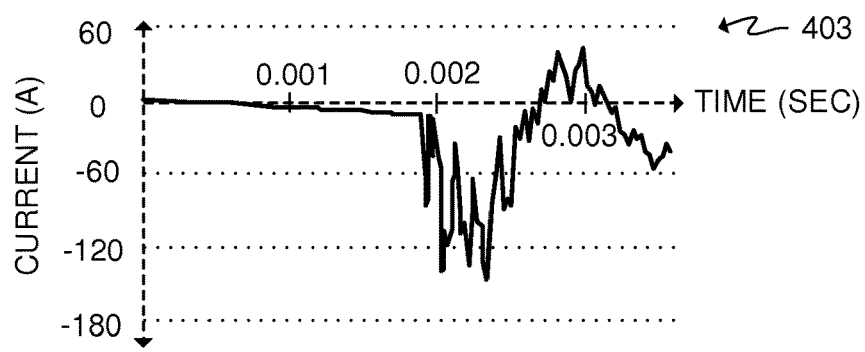
Figure 4D:
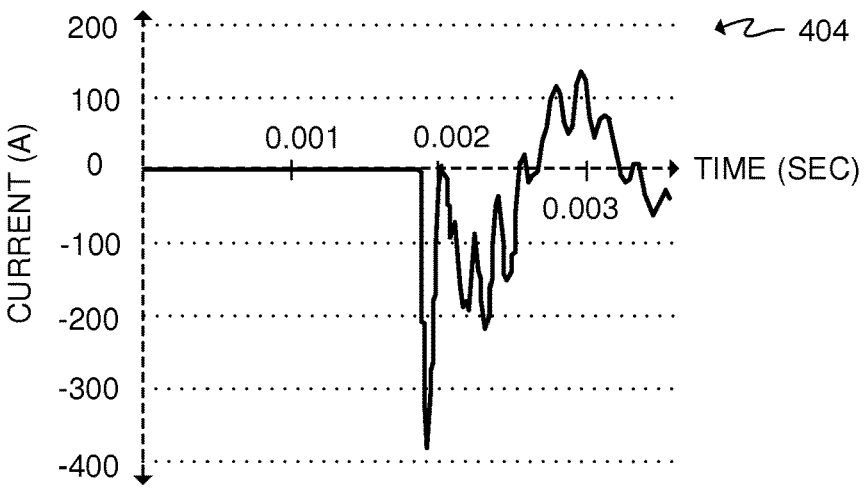
Figure 5A:
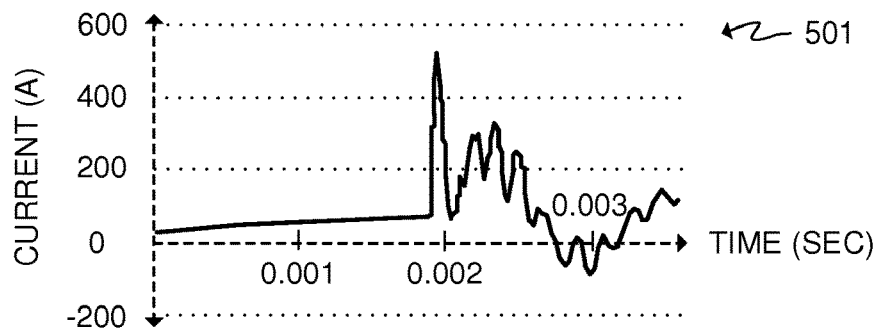
FIGS. 5A-5D illustrate currents of three phases and zero sequence current, respectively, of a faulty line during one arcing-type or intermittent ground fault event.
Figure 5B:
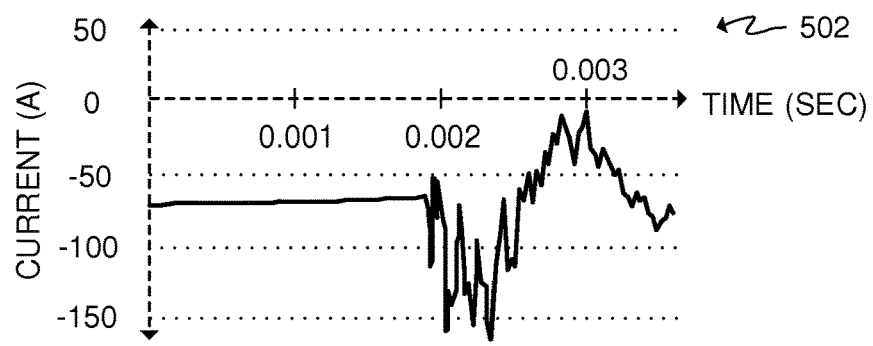
Figure 5C:
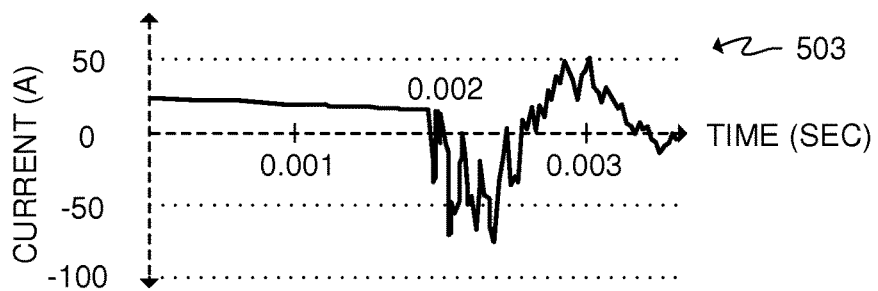
Figure 5D:
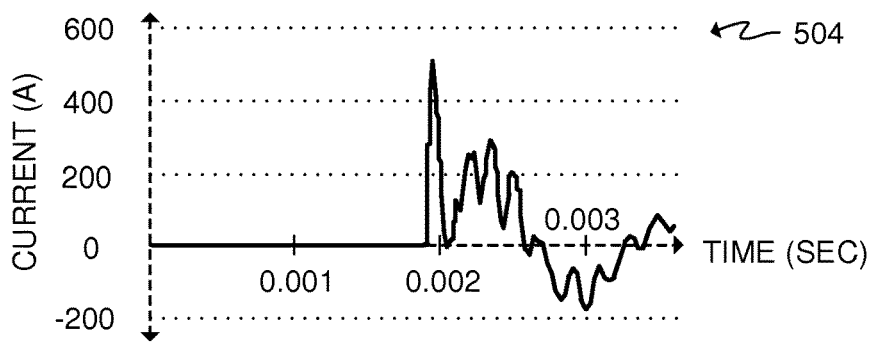

As described hereinearlier and illustrated in FIG. 3, an arcing-type ground fault event 30 may be divided into two parts: the rapid discharging part 31 and the slower charging part 30. The currents during said two parts sum up during the ground fault event 30. The rapid discharging part 31 occurs during time period 31 and the slower charging part during time period 30. The first peak 33 of the fault current occurring during the time period 31 occurs when the capacitance(s) of the faulty phase discharges. During the slower charging part 30, the voltage of the healthy phases rises and thus the phase-to-ground capacitance charges via the main transformer 1 coils.

The directions or polarities may, preferably, be determined based on the direction or polarity of the first half-cycle, i.e. the first time period, the time period 32 in FIG. 3, of the slower charging part 30.

According to an embodiment, a fourth order Butterworth may be utilized to filter the determined currents so as to obtain the first filtered currents from which the directions or polarities may be determined. The Butterworth filter may, preferably, be of the band-pass-type having lower cutoff frequency of 100 Hz and higher cutoff frequency 600 Hz, which enables determining the directions or the polarities during the first half-cycle 32. The rapid discharging part 31 is thus smoothed out from said first filtered currents.

Step 24 comprises comparing the directions or polarities of the first filtered currents. If the directions or polarities are the same, such as in FIGS. 4A-D (the directions or the polarities of the first half-cycle of the currents are all negative), the current have been determined, and thus the location of the fault detector 10 is, at a point of the network which is either on a healthy line, L1 in FIGS. 1 and 2, or a point "behind" the fault location, i.e., farther along the line from the main transformer 1 or the substation as compared to the fault location 4. In FIGS. 4A-4D, are shown currents of the three phases 401-403, respectively, and the zero sequence current 404.

If, on the other hand, at least one of the directions or polarities of the first filtered currents is opposite with respect to the rest of the directions or polarities of the first filtered currents such as in FIGS. 5A-5D (the directions or the polarities of the first half-cycle of two of the currents are negative and two are positive), the point at which the currents have been determined is located "in front of" the fault location 4, i.e., a point of network between the main transformer or the substation and the fault location 4. In this case, a signal for a detection of a fault is being established. In FIGS. 5A-5D, are shown currents of the three phases 501-503, respectively, and the zero sequence current 504.

The signal for the detection of a fault may be transmitted to a network management system (NMS) or signaled by a visual output, such as a light emitting diode (LED) for a user or maintenance person locating and preparing to repair the fault.

Method execution is ended in step 26. The fault detecting is no longer necessary or the conditions for existence of a fault are no longer present.

According to an embodiment of the present invention, the first threshold value used in the fault detectors 10 may be set to approximately 1 to 6 amperes or preferably 1 to 3 amperes. The chosen threshold value for the sum of the phase currents depends on the preferred sensitivity of the fault indication devices. The threshold may be statically defined or dynamically adjusted based on the network configuration or other parameters.

According to an embodiment, the method according to the present invention may be performed continuously or the method may be initialized after a certain criterion is fulfilled. The criterion may be, for example, a value of zero sequence current with respect to the first threshold. This value of zero sequence current may be determined, for example, continuously, prior to steps 21A-21C.

Figure 6:
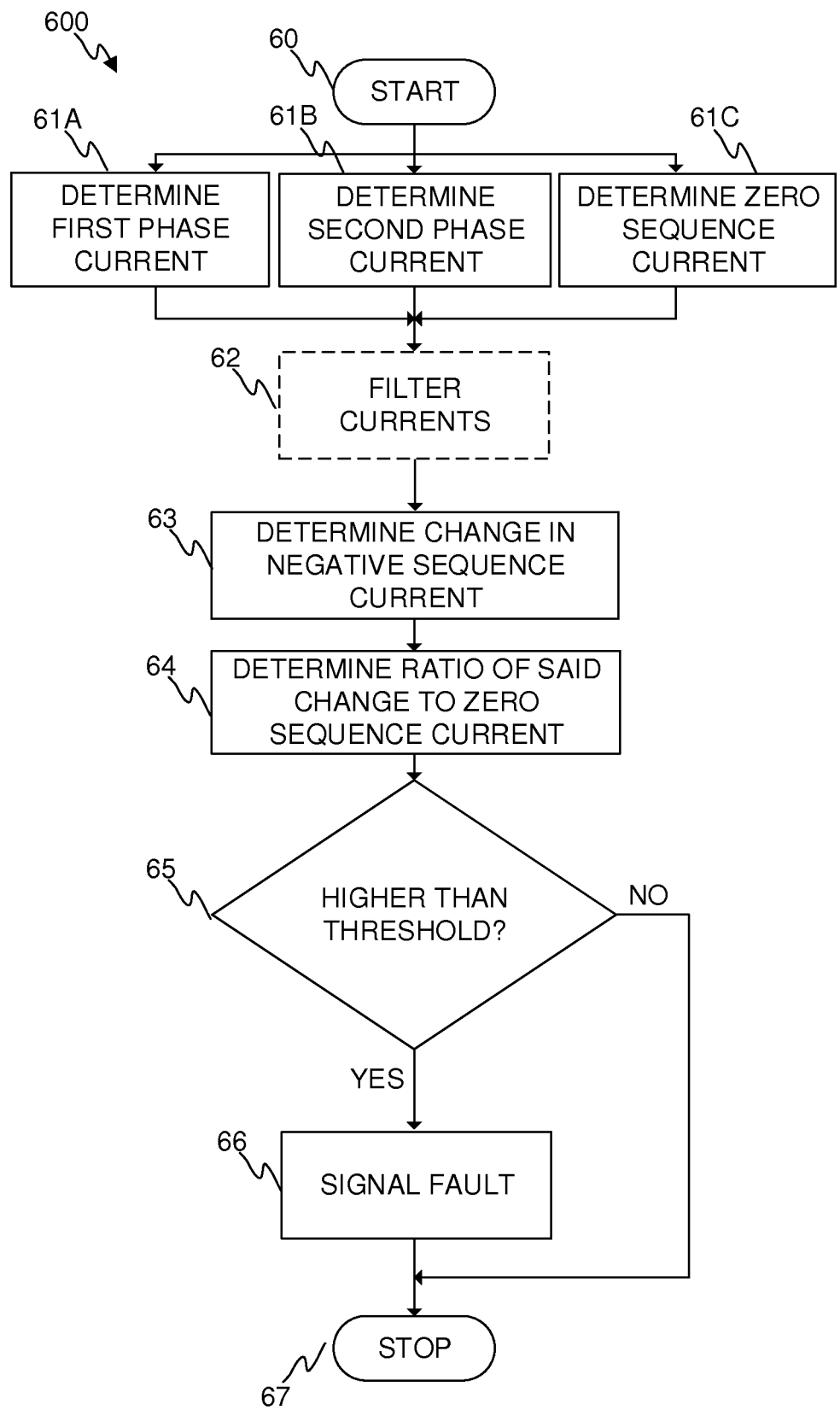
FIG. 6 illustrates a flow diagram of an embodiment of the method according to the present invention directed especially for detecting permanent-type ground faults.

FIG. 6 shows a flow diagram of a method 600 which may be performed in addition to or in parallel with an embodiment of the present invention for detecting faults, especially of permanent-type ground faults. The method at 600 may also be performed separately or individually of the method at 200.

Step 60 refers to a start-up phase of the method. A need for detection of faults is being established and appropriate devices are obtained and arranged in connection with the electrical distribution network. Devices may be configured and communication between different elements in the electrical distribution network may be established. The start-up phase 60 may include criteria for initialization of the method such as, for example, the value of zero sequence current, or the sum of the phase currents, exceeding the first threshold. There may also be other sources utilized to detect and indicate the existence of a fault in the network such as by a relay at the substation or information from a network management system or based on a level of determined zero sequence voltage.

Steps 61A-61C may be identical to the steps 21A-21C shown in FIG. 2 and described hereinearlier in the corresponding parts of the description. The steps 61A-61C may include determining each one of the first phase current, the second phase current and the zero sequence current with a second sampling frequency. The second sampling frequency may, preferably, be 1.6 kHz. The second sampling frequency may also be 3.2 kHz or 6.4 kHz. The second sampling frequency may be different or equal to the first sampling frequency.

Prior to performing the method illustrated in FIG. 6, step 62, an optional feature, may be utilized to filter some frequency components out of the determined currents, preferably, frequency components with higher frequency than the fundamental frequency of the electrical distribution network. In step 62, filtering may be done so as to determine a second filtered zero sequence current, a second filtered first phase current, and a second filtered second phase current. The filtering may be performed by using analog filters or, preferably, by means of digital filtering. Different frequency components may be determined by using numerical methods such as FFT implemented on a processor. According to an embodiment, a high-pass filter with cutoff frequency of, for example, 75, 100 or 125 Hz may be utilized to filter the determined currents.

In step 63, based on the determined zero sequence, first phase and second phase currents, the magnitude of a change during a second time period of the negative sequence current may be determined. The second time period may, advantageously, be at least half a fundamental cycle of the electrical distribution network. More advantageously, the second time period may be a full fundamental period of the electrical distribution network such as 20 or 16.7 milliseconds. The determination of said change in the negative sequence current may be determined based on the values of negative sequence current temporally before and after a fault, i.e., $\Delta I_2 = |I_{2,2} - I_{2,1}|$, wherein $\Delta I_2$ is the magnitude of the change of negative sequence current during the fault, $I_{2,2}$ is the value of negative sequence current after the fault and $I_{2,1}$ the value of negative sequence current before the fault. In order to increase the accuracy of the negative sequence current, FFT may be used in step 62 to filter the determined currents so that they substantially comprise only of the fundamental frequency component.

In step 64, the change of negative sequence current $\Delta I_2$ may be compared to the value zero sequence current temporally after the fault 4, i.e., for example, determining the ratio $\Delta I_2/I_{0,2}$, wherein $I_{0,2}$ is the value zero sequence current temporally after the fault 4.

In step 65, the solution or the ratio determined in step 64 may then be compared to a second threshold. The second threshold may be, for example, 0.4. If the solution or the ratio determined in step 64 exceeds the second threshold, it may be concluded that the location at which the currents are determined is located on a faulty line and between the substation, or the main transformer 1, and the fault location 4. In this case the detection of fault is signaled as illustrated in FIG. 6 by step 66. The signal for the detection of a fault may be transmitted to a network management system (NMS) or signaled by a visual output, such as a light emitting diode (LED) for a user or maintenance person locating and preparing to repair the fault.

Method execution is ended in step 67. The fault detecting is no longer necessary or the conditions for existence of a fault are no longer present.

Figure 7:
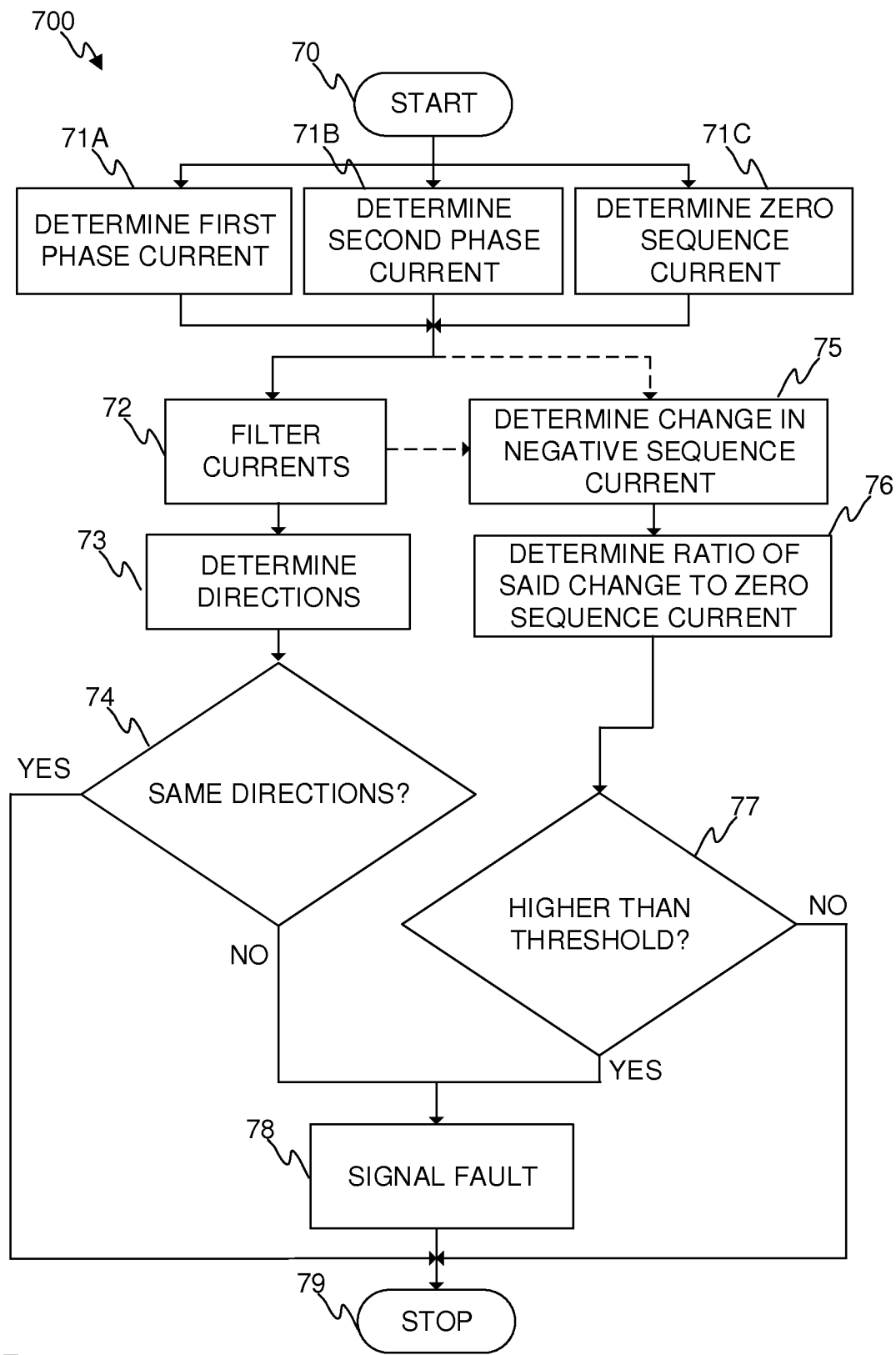
FIG. 7 illustrates a flow diagram of an embodiment of the method according to the present invention.

In FIG. 7, an embodiment of the method according to the present invention is illustrated by a flow diagram at 700. The method at 700 comprises embodiments of both of the methods illustrated in FIG. 2 and in FIG. 6. All the steps at 700 may be identical to ones illustrated in FIGS. 2 and 6, and described hereinearlier in the corresponding parts of the description.

Step 72, however, may comprise the features of both of the steps 22 and 62. The negative sequence current and/or a positive sequence current may be determined with a second sampling frequency or by down-sampling the determined currents in steps 71A-71C.

According to an embodiment, the down-sampling may be performed, advantageously, for the detection of the permanent-type faults but may in addition be utilized for the detection of arcing-type or intermittent faults. According to some embodiments, if the first sampling frequency is 12.8 kHz and every second, fourth or eight sample may be utilized, the second sampling frequency may thereby be, for example, 6.4 kHz, 3.2 kHz or 1.6 kHz, respectively.

The determined currents may be stored on memory means 806. The determined currents may be stored in a buffer or a sliding window memory, i.e., for example, the last 16 samples or the last 20 milliseconds or the last 10 cycles of the electrical distribution network or so depending, for example, on the system specifications and required amount of samples in order to determine different parameters for implementing the method according to some embodiments of the present invention.

Steps of the method according to an embodiment of the present invention at 700 may be performed continuously or the method may be initialized after a certain criterion is fulfilled. The criterion may be, for example, a level of the determined zero sequence current. According to an embodiment, the steps shown in FIG. 2 and the ones shown in FIG. 6 as integrated into one method and illustrated in FIG. 7 may be performed in different manners. This entails, for example, performing the steps in FIG. 6 continuously while performing the steps in FIG. 2 after a criterion, such as a level of zero sequence current, has been fulfilled, i.e. for example when the first threshold has been exceeded.

In step 72, in addition to determination of the first filtered currents, the second filtered currents may be determined. Step 72 may be executed on a processor in a fault detector 10 in case where only the first filtered currents are being determined or in case where also the second filtered currents are being determined. This yields a simple and cost-effective structure for the fault detector 10 with various functionalities.

The method according to an embodiment of the present invention may comprise alternative or in addition to determining the negative sequence current, determining a positive sequence current. The determined positive sequence current may be used to detect symmetrical faults in the electrical distribution network such as three-phase short-circuit faults. According to an embodiment, a fault may be detected when the positive sequence current determined during a third time period exceeds a third threshold after which the detection may be signaled to, e.g., a network management system or indicated by a LED in order for a maintenance person to detect the signaling of the detection of the fault. The third time period may be equal to the second time period or may be different. The third threshold may be, for example, 100 A to 1000 A depending on the electrical distribution network. The third threshold may be of the constant current, constant time delay, inverse time or an adaptive type threshold.

The negative and positive sequence currents may be determined by storing determined currents on a buffer or a sliding window memory. In this case the windows should, preferably, be configured to be at least half of a fundamental cycle of the electrical distribution network.

According to an embodiment of the present invention, the methods may be implemented by computer program product or computer program code when executed on a processor.

Figure 8:
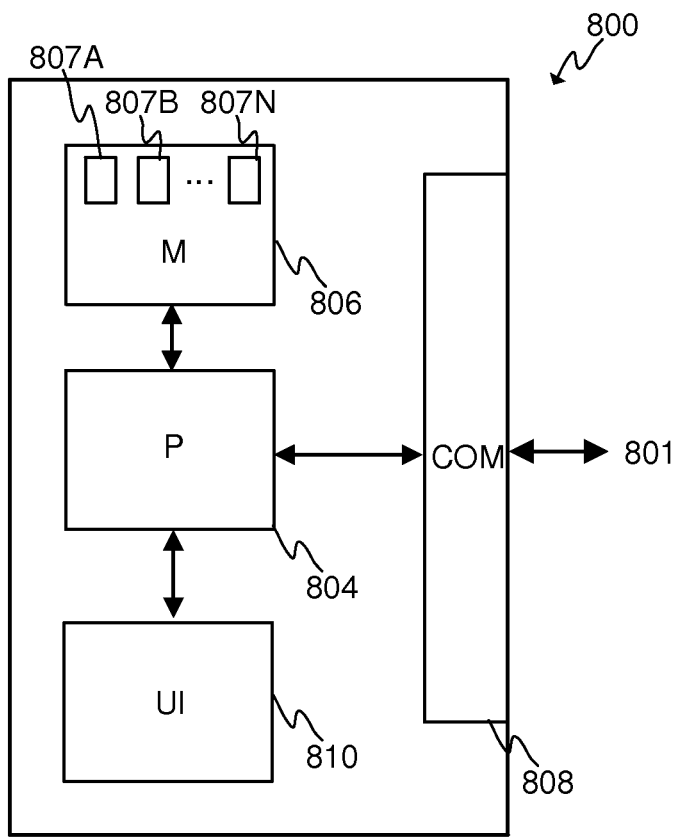
FIG. 8 illustrates schematically a fault detector control unit according to an embodiment of the present invention.

FIG. 8 illustrates schematically a fault detector control unit 800 for implementing to method according to an embodiment of the present invention. The method according to an embodiment of the present invention may be executed by a computer in connection with the fault detector 10 comprising at least a processor 804 and a memory 806. The steps of the method may be programmed to the memory 806, e.g. a non-transitory, computer readable medium, and executed by the processor 804, such as a (micro)processor. According to an embodiment, the method may at least partly be performed by a processor 804 in the fault detector control unit 800. According to another embodiment, the method may at least partly be performed by a separate processor in the fault detector 800. In some embodiments, the method may be performed in a distributed manner by a plurality of processors such as partly by the processor in the fault detector 800 and partly by the processor in, for example, the network management system.

External units 801 may be connected to a communication interface 808 of the fault detector control unit 800. External unit 801 may comprise wireless connection or a connection by a wired manner or, for example, a display. The communication interface 808 provides interface for communication with external units 801 such as routers, other fault detector 10, relays, substation automation devices, network management systems, etc. There may also be connection to local devices such as a laptop or a handheld device. There may also be a connection to a database of the fault detector 10 or an external database including information used in controlling the operation of the fault detector or detectors such as a database of a network management system.

A fault detector control unit 800 may comprise one or more processors 804, one or more memories 806 being volatile or non-volatile for storing portions of computer program code 807A-807N and any data values and possibly one or more user interface units 810. The mentioned elements may be communicatively coupled to each other with e.g. an internal bus.

The processor 804 of the fault detector control unit 800 is at least configured to implement at least some method steps as described. The implementation of the method may be achieved by arranging the processor 804 to execute at least some portion of computer program code 807A-807N stored in the memory 806 causing the processor 804, and thus the fault detector control unit 800, to implement one or more method steps as described. The processor 804 is thus arranged to access the memory 806 and retrieve and store any information therefrom and thereto. For sake of clarity, the processor 804 herein refers to any unit suitable for processing information and control the operation of the fault control unit 800, among other tasks. The operations may also be implemented with a microcontroller solution with embedded software. Similarly, the memory 806 is not limited to a certain type of memory only, but any memory type suitable for storing the described pieces of information may be applied in the context of the present invention.

The communication interface 808 may comprise an antenna and/or a communication port for wired communication technology, e.g. Ethernet or other local area network (LAN) interface. In case of wireless communication, the receiver may utilize e.g. radio frequency technologies such as IEEE 802.15.4-based Zigbee®, wireless local area network (WLAN), Global System for Mobile Communication (GSM®), Third Generation (3G), Long Term Evolution (LTE®) technologies.

Figure 9:
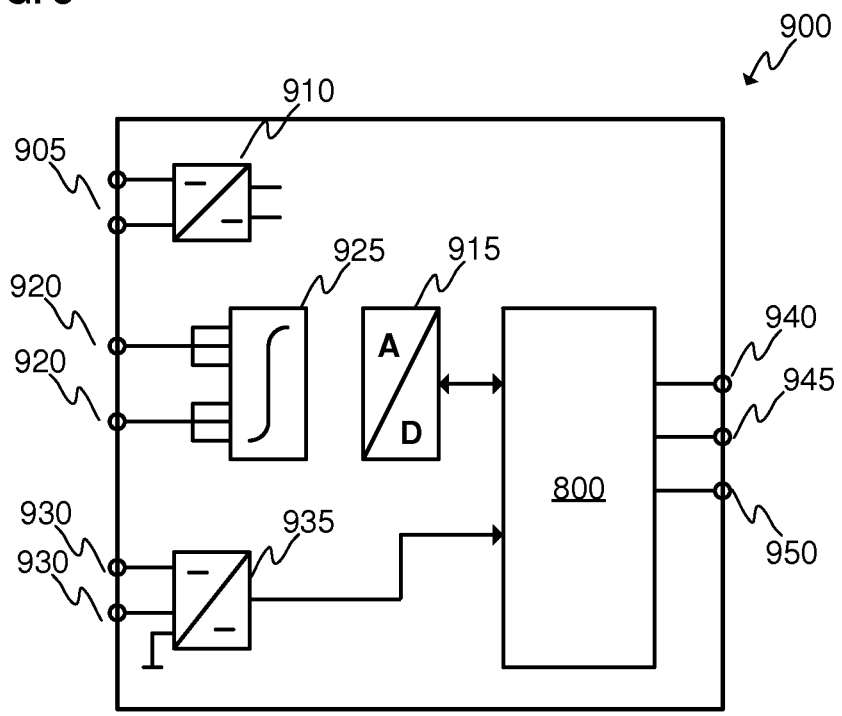
FIG. 9 illustrates schematically a fault detector according to an embodiment of the present invention.

FIG. 9 illustrates schematically at 900 a fault detector 10 according to an embodiment of the present invention. The fault detector 10 may comprise a fault detector control unit 800 such as for example shown in FIG. 8 or may comprise a separate processor capable of being configured to implement at least a part of a method according to an embodiment of the present invention. The fault detector 10 may comprise a power source connection means 905 to which a direct current (DC) or an alternating current (AC) source may be connected to provide power. The fault detector 10 may comprise a DC/DC converter 910 and/or an AC/DC converter capable of converting the characteristics of the electrical power from the source suitable for the fault detector 10.

According to an embodiment of the present invention, the fault detector 10 may comprise one or several inputs. These may include measurement of currents 920 and/or voltages 920 of the electrical distribution network such as phase currents 920 or voltages 920 or the sum of phase currents 920 or voltages 920 as well as for determining electrical powers, apparent, active and/or reactive powers. There may be various filters utilized to filter the measurements such as an integrator-type filter 925.

According to an embodiment of the present invention, there may be an analog-to-digital converter 915 or converters 915 to be used the convert analog signals to digital signals to be fed into the fault detector control unit 800 or the separate processor. There may also be digital inputs 930 through which the fault detector 10 may be configured or reconfigured. There may also be interfacing device 935 or devices 935 for the digital inputs 930.

According to an embodiment of the present invention, the fault detector 10 may comprise connection means for auxiliary measurements such as a capacitive voltage measurement 940, e.g., a capacitive voltage divider. There may also be connection means 945 for the external units 801. There may also be wired communication means such as an Ethernet connection in wired manner 950, e.g., through an RJ45 connector. The fault detector 10 may also comprise infrared or other such wireless communication means.

According to an embodiment of the present invention, the fault detector 10 may comprise one or several communication modules 808 such as to communicate with external devices or systems wirelessly or in wired manner. The fault detector may be configured to communicate using various protocols such as defined in IEC (International Electrotechnical Commission) 61850 standard, IEC 60870-5-104 standard, in compliance with CANOpen®, or Internet of Things (IoT) protocols such as Long range wireless protocol LoRa®. The fault detector 10 may be configured to transmit the fault detection signal and/or the fault non-detection signal to a network management system wirelessly or in wired manner. Power line communication (PLC) may also be used to transmit signals to an external device or system.

The fault detector 10 may be in direct communication with the network management system or may communicate through a router device. The router device may be connected to a number of fault detectors and serve, for example, all fault detectors in a certain specific area. According to an embodiment, an extension unit may be connected to a fault detector or fault detectors. The extension unit may be used, for example, in case when more measurements are needed than a fault detector 10 according to an embodiment of the present invention comprises. This may be needed in case of several lines starting from one location or where several transformers are arranged to one location which then requires the use of a plurality of fault detectors 10 in one location. The plurality of fault detectors may then be operated through the extension unit.

According to one embodiment of the present invention, the fault detector 10 comprises an internal energy storage unit such as, e.g., a battery or a supercapacitor. According to another embodiment, the fault detector 10 may comprise a connection to a backup power source such the ones typically utilized in remote-controlled disconnector stations. According to still one embodiment, the fault detector 10 may have a connection to an energy harvesting unit such as, e.g., a photovoltaic solar or wind power system. There may be also a connection to backup power system such as an uninterruptible power supply (UPS) system or a system comprising, e.g., a fuel cell or an auxiliary power generation system such as a reciprocating engine connected the an electrical generator and the system having suitable power conversion units, e.g. including power electronic components, to provide electricity for the fault detector 10.

Figure 10:
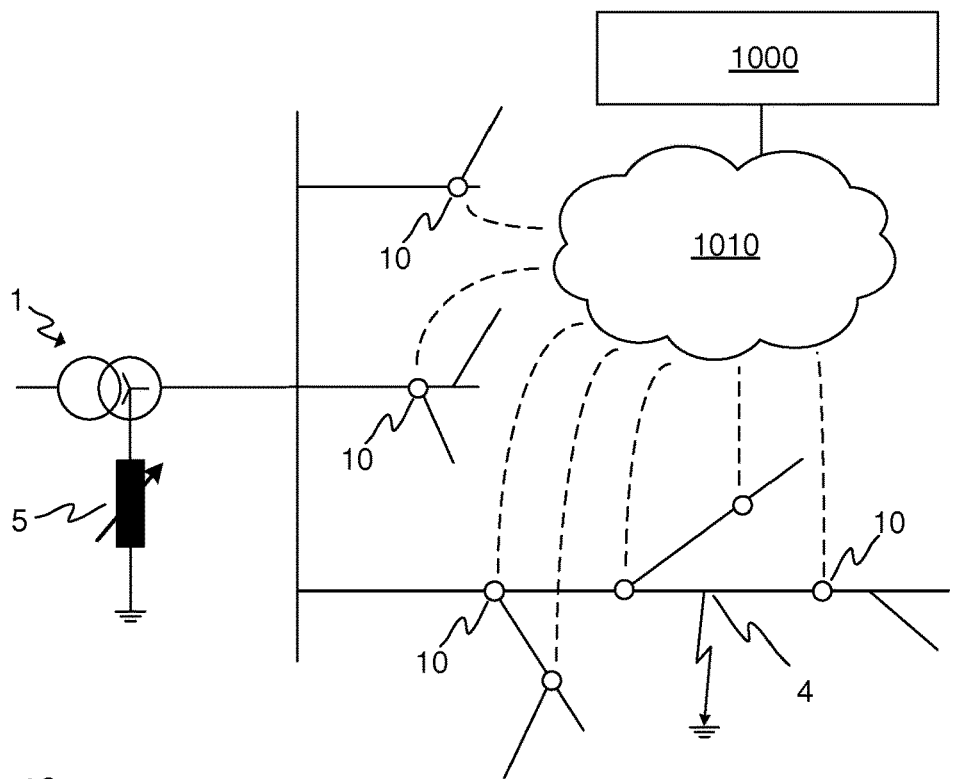
FIG. 10 illustrates an embodiment of a system according to the present invention utilizing at least one fault detector in accordance with some embodiments of the present invention.

One embodiment of the present invention is schematically shown in FIG. 10, wherein multiple fault detectors 10 arranged in multiple locations in the compensated electrical distribution network operated in a radial configuration are shown.

FIG. 10 illustrates schematically the operation of the method according to an embodiment of the present invention. In FIG. 10, the compensated electrical distribution network is shown by using a one-line diagram. The fault detectors 10 send the detection or non-detection signal to a network management system 1000 via a communication network 1010 by using the communication interface 808 or other communication means 950.

According to an embodiment of the present invention, the fault detectors 10 may, advantageously, be arranged in close vicinity to distribution transformers 2 so that a low voltage power source may readily be available. The fault detectors 2 may also be arranged along the lines as well as to an overhead line to underground cable interface which enable detecting whether the fault is in the overhead part or the underground cable part of the line. According to still another embodiment, the fault detectors 10 may be arranged at the remote-controlled disconnector stations which typically have auxiliary power systems which include backup electrical power source in case of disturbances in the network.

Figure 11:
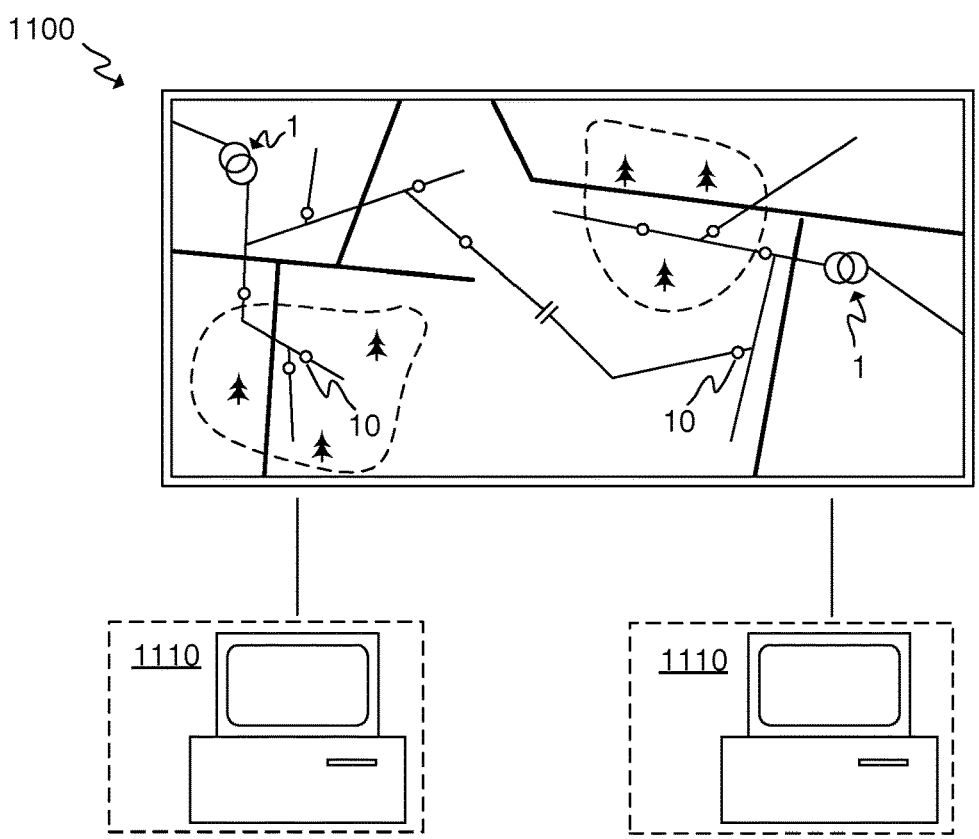
FIG. 11 illustrates a network management system which may be utilized with the methods, devices, and systems according some embodiments of the present invention.

According to an embodiment of the method in accordance with the present invention is to utilize fault detectors 10 for locating the fault by utilizing the network management system 1100 or a monitoring system 1100 as shown in FIG. 11. In FIG. 11, the compensated electrical distribution network operated in a radial configuration is shown in a topographic map. It can be seen that the lines may be located and/or go through forests (shown with a symbol of a spruce). There may be roads (thick lines) close to the network in which case there is an easy way to maintain and check the condition of the network. The monitoring system 1100 may comprise one or more computers 1110 with suitable user-interface and software. The monitoring system 1100 may include, e.g., a supervisory control and data acquisition (SCADA) system, a distribution management system (DMS) or a network management system (NMS) or at least a part of these systems.

According to an embodiment of the present invention in FIG. 11, the status of each of the fault detectors 10 may be shown on the map (not visible in FIG. 11) or other graphical/visual presentation displayed on the computers of the monitoring system 1110. The detection or non-detection may preferably be shown for each of the fault detectors 10. The locating of the fault may then be performed by reasoning by the operator or by using, e.g., an algorithm that can automatically locate the fault based on signals received from the fault detectors 10.

The monitoring system according to an embodiment of the present invention may comprise at least one computer which is functionally connected to the fault detectors 10 via a communication network 1010 and capable of sending control signals to relays and other protective devices in the distribution network. The computers 1110 comprise a processing unit, a memory unit, a communication unit and a suitable user interface as well as suitable operating system software. The monitoring system may also be capable of sending signals to the fault detectors 10. The monitoring system 1100 may actually be capable of transferring revised fault monitoring logic to the fault detectors such as, e.g. the threshold for the sum of the phase currents or other parameters such as operation mode according to which detection or non-detection signal may be sent to the monitoring system.

According to a particular embodiment, the monitoring system includes an algorithm which process the received detection and/or non-detection signals from fault detectors 10 by categorizing or grouping the fault detectors 10 based on, e.g., on which feeder or part of the network the particular fault detector 10 is located. Because the fault detectors 10 have been arranged in certain location, they may be assigned a number representing an order in the sequence of fault indication devices. By comparing the detection signals and the sequence numbers, the algorithm is capable of determining the location of the fault to a particular part or section of the network. The location information may then be forwarded directly to an operator or a working group in order to clear or the repair the faulted part of the network.

The specific examples provided in the description given above should not be construed as limiting the applicability and/or the interpretation of the appended claims. Lists and groups of examples provided in the description given above are not exhaustive unless otherwise explicitly stated.

The invention claimed is:

1. A method for detecting faults in a three-phase electrical distribution network, wherein the method comprises
    determining a zero sequence current, a first phase current and a second phase current at a location of the three-phase electrical distribution network,
    determining a first filtered zero sequence current, a first filtered first phase current and a first filtered second phase current by removing a frequency component from the zero sequence, the first phase and the second phase currents corresponding to a fundamental frequency of the electrical distribution network through filtering out said frequency component, said first filtered currents thereby including frequency components other than said removed frequency component,
    determining a direction of the first filtered zero sequence current, a direction of the first filtered first phase current and a direction of the first filtered second phase current during a first time period,
    comparing said directions relatively to each other, and, if at least one of the determined directions is opposite with respect to at least one of the other two determined directions,
    signaling a detection of a fault.

2. The method according to claim 1, wherein the method wherein the method, prior to the determination of said first filtered currents, comprises
    determining a second filtered zero sequence current, a second filtered first phase current and a second filtered second phase current by filtering the zero sequence current, the first phase current and the second phase current with respect to the fundamental frequency of the electrical distribution network, said second filtered currents thereby comprising only said fundamental frequency component.

3. The method according to claim 1, prior to the determination of said first filtered currents, comprises
    determining a negative sequence current based on the zero sequence current based on zero sequenced, the first phase and the second phase currents or based on second filtered currents during a second time period,
    determining a magnitude of a change during the second time period in the negative sequence current based on values of the negative sequence current temporarily before and after a fault,
    comparing said change to a value of zero sequence current temporarily after said fault, and, if the magnitude of said change with respect to the zero sequence current after said fault exceeds a second threshold,
    signaling a detection of said fault.

4. The method according to claim 1, prior to the determination of the zero sequence current, the first phase current and the second phase current, at the location of the three-phase electrical distribution network, wherein the method comprises
    comparing a value of zero sequence current to a first threshold.

5. The method according to claim 1, prior to the determination of said first filtered currents, the method comprises
    determining a positive sequence current during a third time period based on the frequency component of the zero sequence, the first phase and the second phase currents corresponding to the fundamental frequency of the electrical distribution network or based on said second filtered currents,
    comparing the positive sequence current to a third threshold and, if the positive sequence current exceeds the third threshold,
    signaling a detection of a fault.

6. The method according to claim 1, comprising
    determining zero sequence current directly by a measurement of a sum phase currents.

7. The method according to claim 1, wherein the determination of the zero sequence current, the first phase current and the second phase current at the location of the three-phase electrical distribution network comprises
    determining the zero sequence current, the first phase current and the second phase current with a first sampling frequency.

8. The method according claim 2, wherein at least one of the following is determined based on a determination of the zero sequence current, the first phase current and the second phase current with a second sampling frequency: the negative sequence current, the positive sequence current.

9. The method according to claim 2, wherein at least one of the following is determined based on a determination of the zero sequence, the first phase and the second phase current by down-sampling the determined the first phase, the second phase and zero sequence currents: the negative sequence current, the positive sequence current.

10. A fault detector control unit, wherein the fault detector control unit comprises
    at least one processor, and
    at least one memory storing at least one portion of computer program code, wherein the at least one processor being configured to cause the fault detector control unit at least to perform:
    determine a zero sequence current a first phase current and a second phase current at a location of the three-phase electrical distribution network,
        determine a first filtered zero sequence current, a first filtered first phase current and a first filtered second phase current by removing a frequency component from the zero sequence, the first phase and the second phase currents corresponding to a fundamental frequency of the electrical distribution network through filtering out said frequency component, said first filtered currents thereby including frequency components others than said removed frequency component,
    determine a direction of the first filtered zero sequence current, a direction of the first filtered first phase current and a direction of the first filtered second phase current during a first time period,
    compare said directions relatively to each other, and, if at least one of the determined directions is opposite with respect to at least one of the other two determined directions,
    signal a detection of a fault.

11. A fault detector, wherein the fault detector comprises a fault detector control unit according to claim 10, the fault detector further comprising
- means for determining a zero sequence current, a first phase current and a second phase current,
- means for imputing the determined zero sequence current, the first phase current and the second phase current to the fault detector control unit, and
- means for external communication.

12. An arrangement, wherein the arrangement comprises a number of fault detectors according to claim 11 arranged along a three-phase electrical distribution network for detecting faults in the electrical distribution network based on signaling a detection of a fault by at least one of the number of fault detectors via a communication network to a network management system.

13. A non-transitory computer readable storage medium containing computer executable instructions which when executed by a fault detector control unit of claim 10 cause the fault detector control unit to perform the method according to claim 1.

* * * * *